United States Patent [19]

Mircea

[11] Patent Number: 4,714,594
[45] Date of Patent: Dec. 22, 1987

[54] REACTOR FOR VAPOR PHASE EPITAXY

[76] Inventor: Andréi S. Mircea, 31 rue Frederic Mistral, 91330 Yerres, France

[21] Appl. No.: 748,443

[22] Filed: Jun. 25, 1985

[30] Foreign Application Priority Data

Jun. 27, 1984 [FR] France ................. 84 10154

[51] Int. Cl.⁴ ............. C30B 35/00; C30B 25/10; C23C 16/00; B05D 5/12
[52] U.S. Cl. .................... 422/245; 427/72; 427/255.5; 118/725; 118/730; 156/610; 156/612; 156/613; 156/DIG. 98
[58] Field of Search ............ 156/613, 612, 610, 622, 156/624, DIG. 98; 422/245, 90, 88, 129, 232; 118/729, 730, 720, 721, 428, 500; 427/82, 252, 86, 72, 251, 255.5

[56] References Cited

U.S. PATENT DOCUMENTS

| | | | |
|---|---|---|---|
| 3,436,255 | 4/1969 | Harris et al. ................. | 156/613 |
| 3,696,779 | 10/1972 | Murai et al. ................. | 118/730 |
| 3,981,791 | 9/1976 | Rosvold ...................... | 118/730 |
| 4,063,974 | 12/1977 | Fraas .......................... | 156/612 |
| 4,082,865 | 4/1978 | Ban et al. .................... | 427/253 |
| 4,131,496 | 12/1978 | Weitzel et al. ............... | 156/612 |
| 4,222,345 | 9/1980 | Bergfelt et al. .............. | 427/251 |
| 4,284,033 | 8/1981 | del Rio ....................... | 118/730 |
| 4,373,988 | 2/1983 | Bauser et al. ................ | 156/622 |
| 4,526,805 | 7/1985 | Yoshizawa .................. | 427/255.5 |

OTHER PUBLICATIONS

French Search Report, FR 84 10 154.

Primary Examiner—Gary P. Straub
Attorney, Agent, or Firm—Oblon, Fisher, Spivak, McClelland & Maier

[57] ABSTRACT

A reactor for vapor phase epitaxy, wherein to bring about a vapor phase epitaxial growth or epitaxy on one face of a substrate, the latter is heated and placed in an epitaxy gas stream flowing in a given direction and the face is kept parallel to the direction and in a position where the gases play upon the same and such performs rotary movement about an axis which is perpendicular to the face and to the direction.

5 Claims, 1 Drawing Figure

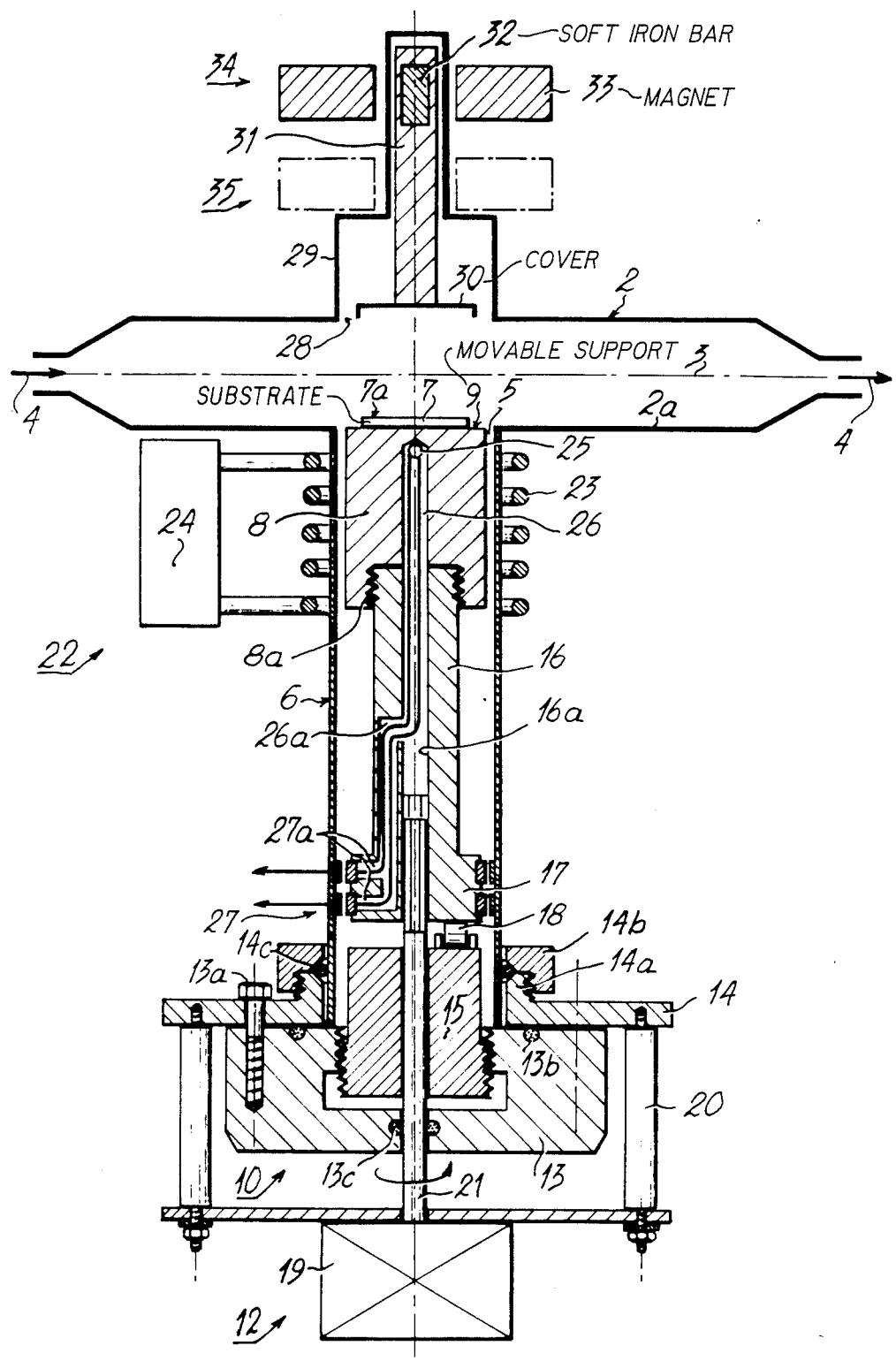

REACTOR FOR VAPOR PHASE EPITAXY

BACKGROUND OF THE INVENTION

1. Field of the Invention

The present invention relates to an apparatus for vapour phase epitaxy. For example, such is applicable to the formation of heterostructures intended for the production of electronic components, such as field effect transistors, or optoelectronic components, such as semiconductor lasers.

2. Discussion of the Background

Two groups of vapour phase epitaxy methods are known. According to these, epitaxy is performed on one face of a substrate, which is heated and placed in an epitaxy gas stream flowing in a given direction. More specifically, according to the methods of the first group, the substrate is placed on a fixed support, which is arranged in a reaction chamber parallel to the walls thereof, whilst according to the second group, the substrate is positioned perpendicularly to the direction of the epitaxy gas stream and optionally rotates about an axis parallel to said direction.

The methods of the first group favour a laminar flow of the epitaxy gases, which minimizes the residence time of a given gas molecule in the reaction chamber. The epitaxial layers formed thus have very abrupt composition transitions, which is very favourable to the performances of the electronic components produced from said epitaxial layers. Nevertheless, the methods of the first group suffer from the disadvantage of leading to epitaxial layers, whose thickness and composition are not very uniform. Thus, with these methods, there is a depletion of active substances present in the epitaxy gases in the flow direction thereof. This can be compensated by slightly inclining the substrate support relative to the epitaxy gas flow direction, but this compensation cannot be obtained in a uniform manner over a considerable distance and no matter what the composition of the layers to be deposited.

The methods of the second group make it possible to improve the composition uniformity of the epitaxial layers as a result of a more uniform distribution of the constituents of the gaseous phase on the substrate surface and also due to the fact that it is possible to turn said substrate. Nevertheless, the methods of the second group suffer from the disadvantages of not being able to obtain a radial uniformity of the composition of the layers. In addition, the flow of gases is not laminar, because the substrate and its support constitute an obstacle for the flow of gases. Thus, the residence time of the gases in the reaction chamber is longer, which leads to less abrupt composition transitions in the epitaxial layers than in the case of the methods of the first group.

SUMMARY OF THE INVENTION

The object of the present invention is to obviate the aforementioned disadvantages, whilst making it possible to produce epitaxial layers having a good, and in particular lateral thickness, and composition uniformity, whilst also having very abrupt composition transitions, i.e. very precise interfaces.

More specifically, the present invention relates to a process for vapour phase epitaxy on one face of at least one substrate, consisting of placing the heated substrate in an epitaxy gas stream flowing in a given direction, characterised in that said face is maintained parallel to said direction and in a position where the gases play upon it, whilst performing a rotary movement about an axis, which is perpendicular to said face and to said direction.

The present invention also relates to a reactor for vapour phase epitaxy on at least one face of a substrate comprising at least one support, on whose face the substrate is to rest, mean for heating the substrate and a chamber for the circulation of an epitaxy gas stream in a given direction, characterised in that the chamber has at least one opening for receiving the face of the support provided with the substrate and in that the reactor also comprises positioning means for positioning the face of the support substantially in the opening and parallel to said direction, as well as means for rotating the support serving to rotate the support face about an axis perpendicular to the support face and to the said direction.

According to the invention, the position of the substrate permits a laminar flow of the epitaxy gases, so that it is possible to obtain very abrupt composition transitions between the epitaxial layers. Moreover, the rotation of the substrate leads to deposits with very good uniformity. Thus, during said reaction, the different points of the face of the substrate on which said deposits are produced, are successively upstream and downstream of the gaseous flow, whilst passing through all the intermediate positions. The composition uniformity is consequently better than obtained with the methods of the first group, but is also better than that obtained with the methods of the second group because, with the present invention, the radial non-uniformity is eliminated or minimized.

According to a special embodiment of the invention, the chamber has several openings, which are transversely aligned with the epitaxy gas flow direction.

With each opening then a corresponding substrate support is provided along with means for heating said substrate, positioning means and support rotation means. Thus, the reactor according to the invention makes it possible to treat several substrates at the same time, at a rate of one or more substrates per support.

According to an advantageous embodiment of the reactor according to the invention, the positioning means are also provided for regulating the position of the support face relative to the corresponding opening.

According to a preferred embodiment of the reactor, the chamber has at least one planar internal wall in which each opening is made.

According to a special embodiment of said reactor, the chamber comprises a main tube in which each opening is formed, the reactor also having at least one secondary tube perpendicular to the main tube and whereof one end communicates with the main tube by said opening, whilst being sealingly connected to the main tube, the heating means having a winding surrounding the secondary tube in the vicinity of said end and the support is longitudinally displaceable in the secondary tube.

Finally, according to a special embodiment, another opening is made in the main tube facing each opening and the reactor also has at least one auxiliary tube communicating with the main tube by said other opening, whilst being sealingly connected to the main tube, a member able to cover the substrates corresponding to said opening being arranged in the auxiliary tube and is movable with respect thereto, so that it can cover the facing substrates, in order to protect them during part of the epitaxy cycle.

BRIEF DESCRIPTION OF THE DRAWINGS

The present invention will be better understood from the following description of a non-limitative embodiment with reference to the attached drawing, wherein:

The sole FIGURE shows a special embodiment of the vapour phase epitaxy reactor according to the invention.

DESCRIPTION OF THE PREFERRED EMBODIMENT

In this special embodiment, the reactor called a "cold wall reactor", comprises a main tube 2 for the circulation of epitaxy gases in a direction corresponding to the axis 3 of said main tube and in a given direction, indicated by arrows 4 in the drawing. The wall of the main tube has an opening 5.

The reactor also comprises a secondary tube 6 perpendicular to the main tube and whereof one end communicates with said main tube via opening 5, said end also being sealingly connected to the main tube.

The reactor for the deposition of one or more epitaxial layers on one face 7a of a substrate 7 also has a substrate support 8, on one face or movable support 9 of which is to rest the substrate 7.

The reactor also has positioning means 10 for displacing support 8 in the secondary tube 6 parallel to axis 11 of the latter, the face 9 of the support remaining perpendicular to said axis 11. The reactor also comprises rotation means 12 for rotating support 8 about axis 11 of the secondary tube.

The positioning means 10 comprise an internally threaded hollow plug 13 fixed, by means of screw 13a, to a base 14. The fixing of the plug to the base makes it possible to crush a sealing O-ring 13b between the same.

Base 14 is perforated. Plug 13 is fixed to one side of the base, the hollow part of the plug being turned towards the perforation of the base. The secondary tube 6 is placed on the other side of the base, facing the perforation thereof. The axis of the plug, the axis of the secondary tube and the axis of the perforation coincide. On the other side, an externally threaded ring 14a is welded to the base, coaxially to the secondary tube. An internally threaded annular coupling 14b is screwed to ring 14a and crushes a sealing O-ring 14c against the latter and the secondary tube 16.

The positioning means 10 also comprise a regulating bearing 15, which is mobile in translation in plug 13 in accordance with the axis 11 of the secondary tube and is externally threaded for this purpose. The secondary tube 6 traverses the perforation of the base and rests by its other end on a ledge made on plug 13, in such a way that the bearing 15 can optionally enter tube 6.

The side of support 8 facing bearing 15 is provided with a coupling 16 extending along axis 11 and whose end, facing the bearing 15, terminates by a plate 17 perpendicular to axis 11. On its face facing plate 17, bearing 15 has a plurality of friction rollers 18 regularly distributed about axis 11 and whereof only one is shown in the drawing, the plate 17 resting against said rollers.

The rotation means 12 comprise a motor 19, which is fixed by spacers 20 to base 14. The shaft 21 of said motor extends along the axis 11 of the secondary tube, through plug 13 and bearing 15, each of which is provided with a perforation for this purpose. A sealing O-ring 13c is provided between shaft 21 and the plug, level with the perforation of the latter. The motor shaft 21 can be fixed to the coupling 16 in order to drive the same and consequently the substrate support, so that it rotates about axis 11. For this purpose, coupling 16 is hollow and the lower part of its inner wall 16a has a polygonal shape, whilst the end of shaft 21 to be in contact with coupling 16 has a complimentary polygonal shape, so that it can be fitted into the coupling.

The reactor according to the invention also has means 22 for heating the substrate comprising a high frequency field winding 23 and a high frequency current generator 24 for supplying said winding. The latter surrounds the secondary tube 6 in the vicinity of the coupling thereof with the main tube 2 and extends over a sufficient length to be able to contain most of support 8.

Support 8 is made from graphite and coupling 16 is made from quartz or a refractory metal (eg. tantalum or molybdenum). The main tube and secondary tube are also of quartz and can be welded to one another in order to obtain a tight coupling between them.

Advantageously, the main tube 2 has at least one planar inner wall 2a in which is formed opening 5, so as to improve the quality of the epitaxial layers obtained. Thus, the substrate face 7a can then be positioned almost exactly in the plane of said wall 2a and consequently the flow of gases is improved. For example, it is possible to use a rectangular main tube. The secondary tube 6 can be cylindrical.

In practice, the main tube is horizontal and the secondary tube vertical. Obviously other positions can be considered for these tubes, e.g. a vertical main tube and a horizontal secondary tube whilst, if necessary, providing means for fixing the substrate to its support which do not disturb the laminar flow of the epitaxy gases, e.g. bonding the substrate to the support and, if necessary, fixing the latter to coupling 16. For this purpose, the end of coupling 16 facing support 8 is threaded and screwed into the latter which is provided with a taphole 8a for this purpose.

The temperature of substrate 7 can be controlled by means of a thermocouple 25. For this purpose, coupling 16 being perforated along axis 11 as stated hereinbefore, a cavity 26 is made along said axis 11 in support 8, starting from the side of the support facing plate 17 and extending up to the vicinity of face 9. Thermocouple 25 is placed in said cavity in such a way that its end is in the vicinity of face 9 and consequently of substrate 7. The information given by the thermocouple is transmitted to measuring means (not shown), e.g. via a rotary contactor 27, the rotary element of said contactor, to which the thermocouple is connected, being located on the periphery of plate 17 and the fixed element of the contactor being located on the inner wall of tube 6. A hole 26a passes along the hexagonal portion of the inner wall of coupling 16 and extends slightly above said portion. Over its entire length, it communicates with the space defined by inner wall 16a. Thermocouple 25 passes into the cavity and then into hole 26a and is connected to the rotary element of the contactor 27 by passages 27a made in plate 17 and issuing onto hole 26a.

In order to fix the substrate to the support, particularly in the case where tube 6 is vertical and is placed above tube 2 which is then horizontal, it is possible for cavity 26 to issue onto face 9 and shaft 21 can be made hollow, so that it is possible to depressurize cavity 26 through shaft 21, the substrate then engaging against face 9.

In order to carry out epitaxy according to the process of the invention, the following procedure is adopted.

Support 8 is discharged by the lower end of secondary tube 6 by removing the motor and its shaft, plug 13, bearing 15 and coupling 16. One or more substrates 7 are placed on face 9 of support 8 and the latter, as well as all the parts which had been removed are refitted. Bearing 15 is screwed into plug 13 beforehand, in such a way that support 8 is in the correct position, i.e. so that the face 9 of said support or more precisely the face of the substrate or substrates, on which the epitaxial layers are to be deposited, is located just above the opening 5 in main tube 2, so that said face of the substrate or substrates is played upon during epitaxy by the epitaxy gases, whose flow in the main tube 2 is then laminar. A planar construction of the inner wall of the main tube 2 having opening 5 facilitates as has been stated, the positioning of support 8, because it is then very easy to place the face of the substrate or substrates substantially in the plane of said wall. As stated hereinbefore, during epitaxy, the support performs a rotary movement about axis 11 due to motor 19.

Obviously, it would be possible to consider placing the substrate or substrates at a random level in the main tube 2, but the flow of epitaxy gases would then be disturbed, which would lead to less satisfactory epitaxial layers.

In a constructional variant, an opening 28 is made in main tube 2. It is symetrical of opening 5 relative to the axis of tube 2. An auxiliary quartz tube 29 is connected to the main tube 2 in accordance with said other opening 28 and is welded thereto. This auxiliary tube is perpendicular to tube 2, has a closed upper end and an adequate size to contain a silica cover 30, which is able to simultaneously cover all the substrates placed on support 8. Cover 30 is extended at the top by a silica rod 31, in whose upper part is embedded a small soft iron bar 32. The latter is maintained at a given position by an annular permanent magnet 33 surrounding auxiliary tube 29. This magnet is maintained in the raised position 34 by appropriate means (not shown). When it is in the raised position, cover 30 is in auxiliary tube 29. When the magnet is moved to a low position 35, the soft iron descends in tube 29 and cover 30 also descends until it covers all the substrates 7 placed on the upper face of support 8. When the magnet is again placed in the raised position, the cover reassumes its position in the auxiliary tube 29. To ensure that the attraction force of magnet 33 on bar 32 is sufficiently large, tube 29 has a reduced diameter in its upper part along which moves magnet 33, the latter having a slightly larger internal diameter than the diameter of tube 29. Cover 30 protects the substrate or substrates during part of the epitaxy cycle.

It would not pass outside the scope of the invention to provide several secondary tubes connected to the main tube and aligned perpendicular to the epitaxy gas flow direction, each secondary tube serving to receive a support for substrate or substrates and provided with positioning, rotation and heating means as described hereinbefore. It would then be possible to provide facing each secondary tube, an auxiliary tube equipped with a mobile cover, as described hereinbefore.

I claim:

1. A reactor for vapour phase epitaxy on one face of at least one substrate, comprising:
   at least one substrate;
   at least one support on one face of which is placed the substrate;
   means for heating the substrate;
   tubular chamber means for circulation of an epitaxy gas stream therein, wherein the chamber means has a planar wall with at least one opening formed therein for receiving the face of the support provided with the substrate, and wherein said chamber means includes a longitudinal axis and a gas inlet and outlet means located at opposite ends of said chamber for flow of gas in a single direction along the longitudinal axis of said chamber and parallel to said face of said support;
   positioning means for positioning the face of the support substantially in said at least one opening of said planar wall and parallel to said direction of said gas flow and
   means for rotating the face of the support about an axis perpendicular to the support face and perpendicular to said direction of said gas stream.

2. Reactor according to claim 1, wherein said support comprises a plurality of supports and said at least one opening comprises a plurality of openings corresponding with said supports which are aligned transversely to the direction of said gas flow.

3. Reactor according to claim 1, wherein said positioning means further comprises means for regulating the position of said one face of said support relative to said at least one opening.

4. A reactor for vapour phase epitaxy on one face of at least one substrate, comprising:
   at least one substrate;
   at least one support on one face on which is placed the substrate;
   means for heating the substrate;
   chamber means for circulation of an epitaxy gas stream in a given direction, wherein the chamber means has at least one opening for receiving the face of the support provided with the substrate, said chamber including gas inlet and outlet means;
   positioning means for positioning the face of the support substantially in said at least one opening and parallel to said direction of said gas stream; and
   means for rotating the face of the support about an axis perpendicular to the support face and perpendicular to said direction of said gas stream wherein the chamber comprises a main tube in which is formed said at least one opening, said reactor comprises at least one secondary tube positioned perpendicular to the main tube and wherein one end of said at least one secondary tube communicates with the main tube by said at least one opening and is sealingly connected to the main tube and wherein said secondary is closed opposite said one end, said heating means comprises a winding surrounding the secondary tube in the vicinity of said one end, and said support is positioned in said secondary tube.

5. Reactor according to claim 4, wherein a second opening is formed in the main tube opposed to said at least one opening and wherein the reactor further comprises at least one auxiliary tube communicating with the main tube by said second opening and being sealingly connected to said main tube, means for covering the substrate corresponding to said at least one opening, said means for covering the substrate being located in the auxiliary tube; and
   means for moving said means for covering the substrate relative to said auxiliary tube such that said means for covering the substrate covers said substrate in order to protect said substrate during part of the epitaxy cycle.

* * * * *